United States Patent [19]
Hachigo et al.

[11] Patent Number: 5,463,901
[45] Date of Patent: Nov. 7, 1995

[54] STACKED PIEZOELECTRIC SURFACE ACOUSTIC WAVE DEVICE WITH A BORON NITRIDE LAYER IN THE STACK

[75] Inventors: Akihiro Hachigo; Hideaki Nakahata; Shinichi Shikata; Naoji Fujimori, all of Hyogo, Japan

[73] Assignee: Sumitomo Electric Industries, Ltd., Osaka, Japan

[21] Appl. No.: 283,251

[22] Filed: Jul. 29, 1994

Related U.S. Application Data

[63] Continuation of Ser. No. 940,483, Sep. 4, 1992, abandoned.

[30] Foreign Application Priority Data

Sep. 27, 1991 [JP] Japan .................... 3-249744

[51] Int. Cl.⁶ ............................ G01L 9/00; H04R 31/00
[52] U.S. Cl. .............................. 73/753; 29/594
[58] Field of Search ........................ 73/703, 723, 753, 73/DIG. 4; 310/313 A, 313 R; 427/100; 501/86; 333/152; 29/594

[56] References Cited

U.S. PATENT DOCUMENTS

| | | | |
|---|---|---|---|
| 4,236,095 | 11/1980 | Ono et al. | 310/313 A |
| 4,427,515 | 1/1984 | Yuhara et al. | 427/100 |
| 4,524,247 | 6/1985 | Lindenberger et al. | 29/594 |
| 4,535,632 | 8/1985 | Sinha et al. | 73/723 |
| 4,558,184 | 12/1985 | Busch-Vishniac et al. | 29/594 |
| 4,952,832 | 8/1990 | Imai et al. | 310/313 A |
| 5,061,870 | 10/1991 | Ieki et al. | 310/313 A |
| 5,127,983 | 7/1992 | Imai et al. | 501/86 |

FOREIGN PATENT DOCUMENTS

| | | |
|---|---|---|
| 63-128179 | 5/1988 | Japan . |
| 63-134662 | 6/1988 | Japan . |
| 63-134661 | 6/1988 | Japan . |
| 63-199871 | 8/1988 | Japan . |
| 64-62911 | 3/1989 | Japan . |
| 1-119673 | 5/1989 | Japan . |

OTHER PUBLICATIONS

Thin Film Materials for Saw Devices by F. Hicknell, 1989 Ultrasonics Symposium pp. 285–289.

*Primary Examiner*—Richard Chilcot
*Assistant Examiner*—William L. Oen
*Attorney, Agent, or Firm*—W. G. Fasse; W. F. Fasse

[57] ABSTRACT

A layer of boron nitride which is relatively easily workable is positioned in a stacked structure in close contact with a piezoelectric member, to provide a surface acoustic wave device which can be driven in a higher frequency range. Such a surface acoustic device (10) has a substrate (1), a boron nitride film (2) formed on the substrate (1), and a pair of interdigital electrodes (3a, 3b) formed on the boron nitride film (2). The interdigital electrodes (3a, 3b) are covered with a piezoelectric film (4), which is in close contact with the boron nitride film (2).

20 Claims, 2 Drawing Sheets

STACKED PIEZOELECTRIC SURFACE ACOUSTIC WAVE DEVICE WITH A BORON NITRIDE LAYER IN THE STACK

This application is a file wrapper continuation; of application Ser. No. 07/940,483, filed on Sep. 4, 1992, now abandoned.

FIELD OF THE INVENTION

The present invention relates to a piezoelectric surface acoustic wave device formed as a stack that includes a boron nitride layer. Such devices are used, for example, as a high frequency filter or the like.

BACKGROUND INFORMATION

A surface acoustic wave device, which is an electromechanical transducer device utilizing surface waves propagated on the surface of an elastic body, has a general structure as shown in FIG. 1, for example. In such a surface acoustic wave device 60, a piezoelectric phenomenon which is caused by a piezoelectric member 61 is utilized for exciting surface waves. When an electric signal is applied to interdigital electrodes 62 which are provided on the piezoelectric member 61, the piezoelectric member 61 is distorted to generate surface acoustic waves, which in turn are propagated along the piezoelectric member 61 and received in other interdigital electrodes 63 as an electric signal. Assuming that $\lambda_0$ represents the electrode period in the interdigital electrodes 62 and 63 and v represents the velocity of the surface acoustic waves in relation to frequency characteristics, this device has a bandpass characteristic with a center frequency $f_0$, which is expressed as $f_0 = v/\lambda_0$.

The surface acoustic wave device can be miniaturized with a small number of components, while it is possible to input/output signals on a surface wave propagation path. Such a device can be used as a filter, a delay line, an oscillator, a resonator, a convolver, a correlator etc. In particular, a surface acoustic wave filter has been practically used by an intermediate frequency filter in television sets for a long time, while the same is now being used as filters for VTR and various communication devices.

A surface acoustic wave device employable in a higher frequency range would be desirable as a surface acoustic wave filter for use in the field of mobile communication, for example. As understood from the above equation, the device has a higher center frequency $f_0$ in its frequency characteristics if the electrode period $\lambda_0$ is reduced or if the velocity v of the surface waves is increased. In relation to this, Japanese Patent Laying-Open No. 64-62911 (1989) in the name of the assignee of the present application, for example, discloses a surface acoustic wave device comprising a piezoelectric member which is stacked on a diamond layer for increasing the velocity v of the surface acoustic waves. Diamond has the highest sound velocity among currently known substances, and is physically and chemically stable. Thus, diamond is suitably employed as a material for increasing the center frequency $f_0$ of the device. On the other hand, it is possible to improve the reliability of the device by increasing the velocity v in the aforementioned manner while relatively increasing the electrode spacing $\lambda_0$.

A diamond layer can be formed by polishing single-crystalline diamond which is prepared by extra-high pressure synthesis. A diamond layer can also be formed by polishing the surface of a diamond film grown by CVD, for example. Such a polishing step which is necessary for forming the diamond layer, however, requires a considerably long time for working, since it is difficult to work diamond.

SUMMARY OF THE INVENTION

In view of the foregoing it is an object of the present invention to provide a surface acoustic wave device which can be operated in a high frequency range, by employing an easily workable material thereby avoiding the use of diamond.

The inventors have searched for an easily workable material having a sound velocity which is close to that of diamond and discovered that boron nitride has such qualities. The piezoelectric acoustic wave device according to the present invention comprises a stack including a boron nitride layer, a piezoelectric layer and an electrode layer.

The boron nitride layer can serve as a substrate for the surface acoustic wave device. Alternatively the boron nitride layer may be formed on a substrate which is made of another appropriate material. Further, while either single-crystalline or polycrystalline boron nitride is usable for the present purpose, single-crystalline boron nitride is preferred for a device which is used in a high frequency range, because single-crystalline boron nitride has a small scattering of surface waves.

The boron nitride layer can be formed on a substrate by vapor deposition. Methods of such vapor deposition include a method of decomposing or exciting a raw material gas with a laser beam (refer to Japanese Patent Laying-Open No. 63-134662 (1988), for example), a method of exciting a raw material gas with plasma (refer to Japanese Patent Laying-Open Nos. 63-199871 (1988) and 63-128179 (1988), for example), a method of passing a raw material gas through nonpolar-discharged microwaves for depositing boron nitride on a heated substrate (refer to Japanese Patent Laying-Open No. 63-134661 (1988), for example), and a method of heating a substrate with a thermoionic emission material and applying high frequency plasma to the substrate for exciting or activating a raw material gas (refer to Japanese Patent Laying-Open No. 1-119673 (1989), for example).

While the boron nitride layer can be made of either hexagonal boron nitride or cubic boron nitride, cubic boron nitride is preferred because of its hardness. A harder boron nitride layer provides a higher center frequency $f_0$. Further, it is possible to mix various elements into the boron nitride layer, to change its electric characteristics.

The piezoelectric layer can be mainly composed of one or more compounds selected from a group of ZnO, AℓN, Pb(Zr,Ti)O$_3$, (Pb,La)(Zr,Ti)O$_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, ZnSe and CdS. While the piezoelectric layer can be made of either a single-crystalline or polycrystalline material, a single-crystalline piezoelectric material is preferred for a device to be used in a higher frequency range, due to small scattering of surface waves. A piezoelectric layer of ZnO, AℓN or Pb(Zr, Ti)O$_3$ can be formed by CVD or sputtering.

According to the present invention, the aforementioned interdigital electrodes are employed in general. Such electrodes can be formed by depositing a metal through photolithography. Alternatively, the electrode may be formed on the boron nitride layer by introducing an impurity into the surface of the boron nitride layer having a high dielectric constant, or introducing a lattice defect by ion implantation or application of an electron beam. Further, a boron nitride layer having a high dielectric constant may be deposited on a substrate by vapor deposition and thereafter another boron nitride layer is deposited as the electrode mixed with an impuritiy, thereby having a lower dielectric constant than the first deposited layer.

The boron nitride layer, the piezoelectric layer and the electrodes are stacked in the following several orders; the boron nitride layer; or the electrodes, and the piezoelectric layer, the boron nitride layer, the piezoelectric layer, and the electrodes; or the piezoelectric layer, the electrodes and the boron nitride layer, as the lower layer, the intermediate layer and the upper layer, respectively.

Among materials capable of increasing the propagation velocity of surface acoustic waves, boron nitride is the hardest material next to diamond. Thus, the surface acoustic waves in a device according to the invention are propagated in boron nitride at a velocity close to that in diamond. The present invention implements a device which can be used in a higher frequency range by stacking a boron nitride layer and a piezoelectric member for increasing the velocity of the surface acoustic waves.

Further, boron nitride can be easily worked by polishing etc. as compared with diamond. Thus, the present device can be easily worked by polishing, in particular, as compared with the conventional device employing diamond, whereby it is possible to reduce the time required for working. According to the present invention, therefore, it is possible to provide a miniature mass-produceable surface acoustic wave device, which can be used in an extra-high frequency range.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 2 to 6 illustrate preferred embodiments of a surface acoustic wave device according to the present invention.

Figure 1:
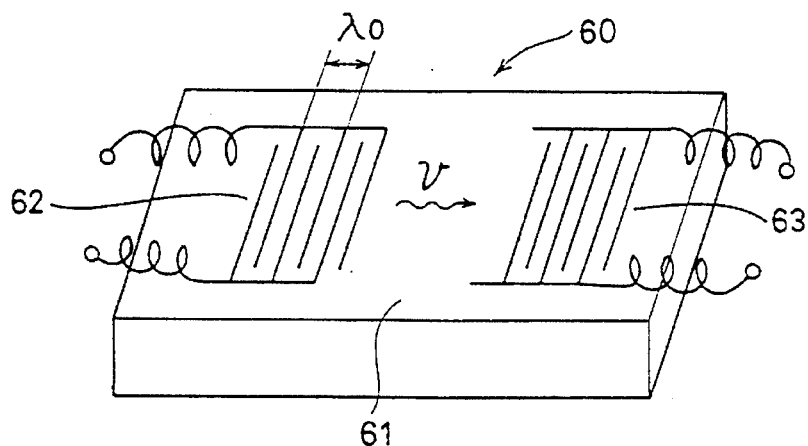
FIG. 1 is a perspective view for illustrating the general structure of a surface acoustic wave device.
Figure 2:
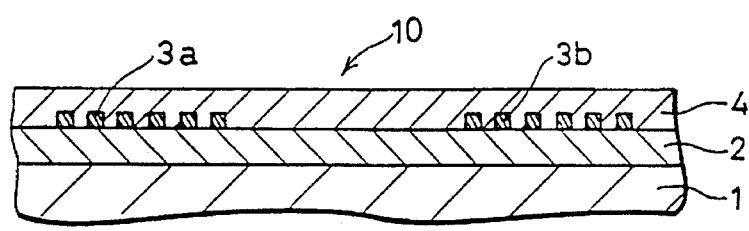
FIG. 2 is a sectional view showing an embodiment of the present surface acoustic wave device.

Referring to FIG. 2, a surface acoustic wave device 10 comprises a substrate 1 for forming a film thereon, a boron nitride layer 2 which is formed on the substrate 1, and interdigital electrodes 3a and 3b which are formed on the boron nitride layer 2. The boron nitride layer 2 and the interdigital electrodes 3a and 3b are covered with a piezoelectric thin film 4.

Figure 3:
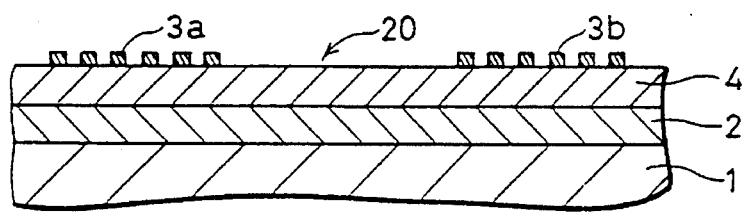
FIG. 3 is a sectional view showing another embodiment of the present surface acoustic wave device.

Referring to FIG. 3, a surface acoustic wave device 20 comprises a substrate 1 for forming a film, a boron nitride layer 2, and a piezoelectric thin film 4 wherein the layer 2 and the film 4 are successively deposited on the substrate 1, and interdigital electrodes 3a and 3b formed on the piezoelectric thin film 4.

Figure 4:
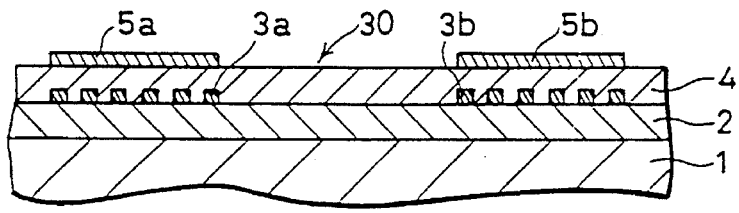
FIG. 4 is a sectional view showing still another embodiment of the present surface acoustic wave device.

Referring to FIG. 4, a surface acoustic wave device 30 similar to that shown in FIG. 2 further comprises short-circuit electrodes 5a and 5b which are formed on a piezoelectric thin film 4.

Figure 5:
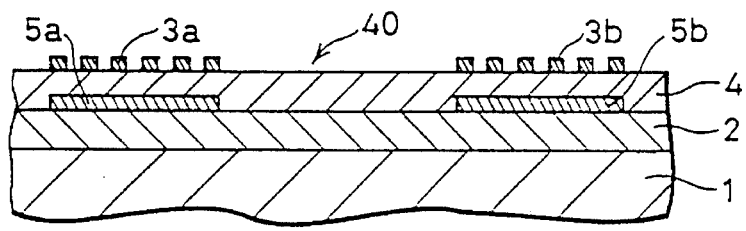
FIG. 5 is a sectional view showing a further embodiment of the present surface acoustic wave device.

Referring to FIG. 5, a surface acoustic wave device 40 similar to that shown in FIG. 3 further comprises short-circuit electrodes 5a and 5b which are formed between a boron nitride layer 2 and a piezoelectric thin film 4.

Figure 6:
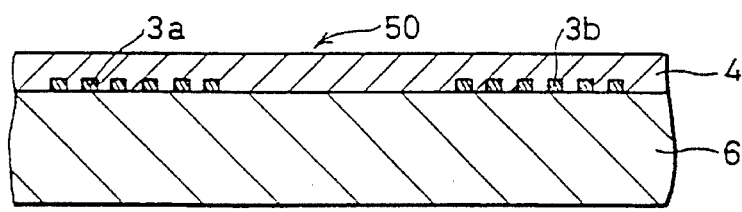
FIG. 6 is a sectional view showing a further embodiment of the present surface acoustic wave device.

Referring to FIG. 6, a surface acoustic wave device 50 comprises a boron nitride substrate 6, a piezoelectric thin film 4 deposited on the substrate 6, and interdigital electrodes 3a and 3b held between the boron nitride substrate 6 and the film 4.

Figure 7:
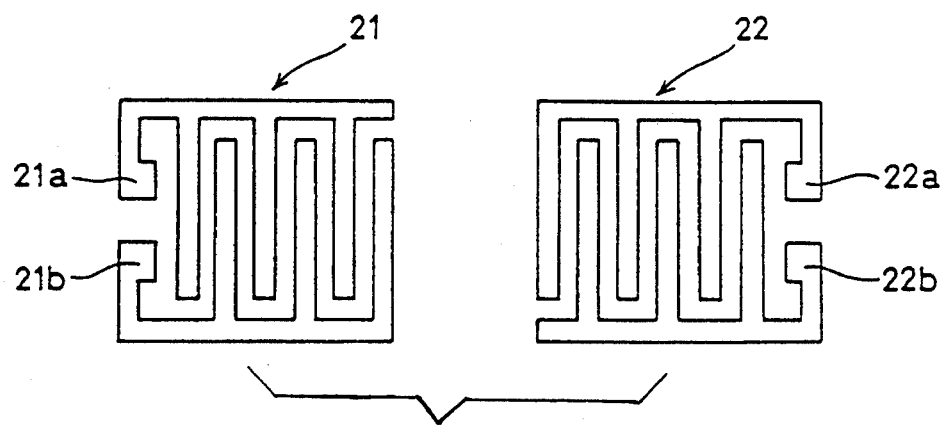
FIG. 7 is a plan view showing an embodiment of electrodes according to the present invention for the present device.

The interdigital electrodes have shapes shown in FIG. 7, for example. Referring to FIG. 7, wherein the electrodes 21 and 22 are formed by alternately arranged reed-screen type electrodes. The electrodes 21 are adapted to receive electric signals through terminals 21a and 21b and to covert these signals to surface acoustic waves. The other electrodes 22 are adapted to output electric signals generated by the surface acoustic waves through terminals 22a and 22b.

Figure 8:
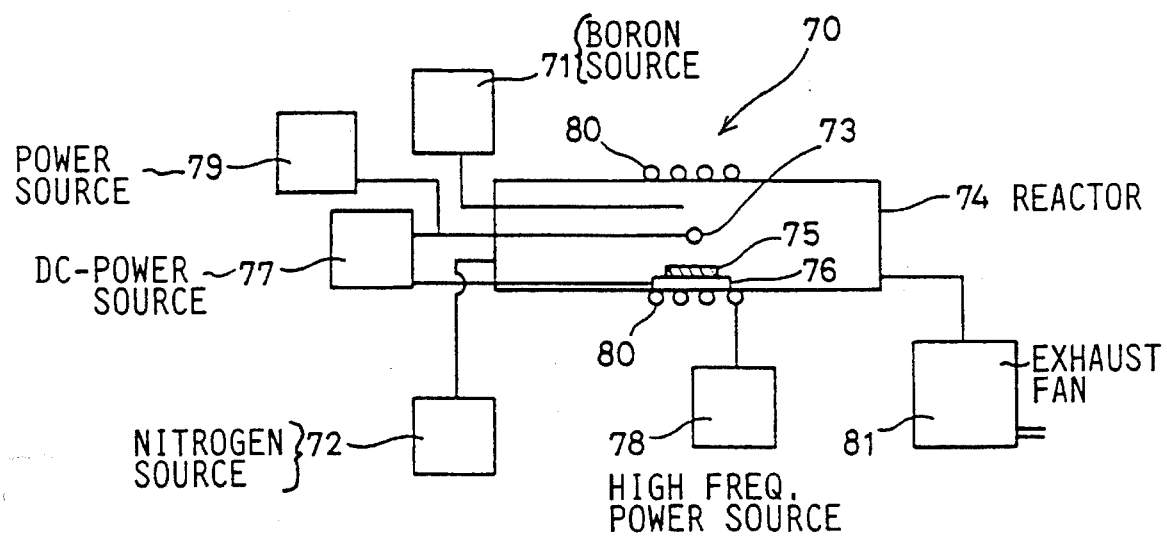
FIG. 8 is a typical diagram showing a plasma CVD apparatus for forming a boron nitride film according to the present invention.

A surface acoustic wave device having the same structure as that shown in FIG. 2 was prepared in practice in the following manner, for example:

First, an apparatus 70 shown in FIG. 8 was employed to form a boron nitride thin film on a molybdenum substrate as follows: A molybdenum substrate 75 was set on a substrate support 76 of the apparatus 70, and thereafter a reactor 74 was evacuated to supply boron fluoride, which was contained in hydrogen as 1 percent by vol., and ammonia from a boron material supply system 71 and a nitrogen material supply system 72 at 10 cc/min. and 30 cc/min. respectively. At this time, the pressure in the reactor 74 was adjusted to 0.3 Torr by an exhauster 81. A thermoionic emission material 73 formed by a tungsten filament was set at a temperature of 2200° C., to raise the temperature of the molybdenum substrate 75 to 950° C. DC discharge was caused by a DC power source 77 across the thermoionic emission material 73, which was heated by a power source 79, and the substrate support 76, while high frequency plasma of 13.56 MHz was applied to the substrate 75 from a high frequency power source 78 of 400 W through an RF coil 80, to form a boron nitride film on the substrate 75. This film was evaluated by X-ray analysis, whereby wide peaks were detected in the vicinity of 2θ=26.7° and 43.2° respectively. This result shows that the so-formed film was composed of a mixture of cubic boron nitride and hexagonal boron nitride.

Then, the surface of the boron nitride film was polished with a wheel having electro-deposited diamond thereon. It was easy to polish the surface. Then, an Aι film having a thickness of 500Å was deposited on the boron nitride film by resistance heating. Thereafter, interdigital electrodes were formed by photolithography.

Then, a ZnO polycrystalline substance was sputtered by magnetron sputtering with a mixed gas of Ar:$O_2$=1:1, a sputtering power of 100 W, and a substrate temperature of 380° C., to deposit a ZnO piezoelectric film. It was possible to drive the so-formed surface acoustic wave device at a high frequency of about 1 GHz with an electrode width of 2 μm.

On the other hand, a single crystal of cubic boron nitride, which was grown for about 40 hours under a high pressure of about 50 kb and a high temperature of about 1600° to 1700° C. by a temperature difference method, was polished. Then, interdigital electrodes were formed on the polished boron nitride single crystal similarly to the above, and a ZnO polycrystalline substance was sputtered by magnetron sputtering with a mixed gas of $Ar:O_2=1:1$, a sputtering power of 100 W, and a substrate temperature of 380° C., to deposit a ZnO piezoelectric film. It was also possible to drive the so-formed surface acoustic wave device at a high frequency of about 1 GHz with an electrode width of 2 μm.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device comprising a stacked structure, said stacked structure comprising: a pair of electrodes, said electrodes being adapted so as to perform conversion between an electrical signal and a surface acoustic wave; a piezoelectric layer being in close contact with said pair of electrodes, said piezoelectric layer being adapted so as to propagate a surface acoustic wave; and a boron nitride layer being in close contact with said piezoelectric layer, said boron nitride layer being adapted to be an insulating layer for improving the velocity of a surface acoustic wave.

2. A surface acoustic wave device comprising a stacked structure, said stacked structure comprising: a pair of electrodes, said electrodes being adapted so as to perform conversion between an electrical signal and a surface acoustic wave; a piezoelectric layer being in close contact with said pair of electrodes, said piezoelectric layer being adapted so as to propagate a surface acoustic wave; and a boron nitride layer being in close contact with said piezoelectric layer, said boron nitride layer being adapted so as to improve the velocity of a surface acoustic wave.

3. The surface acoustic wave device of claim 2, wherein said boron nitride layer includes a polycrystalline boron nitride material.

4. The surface acoustic wave device of claim 2, wherein said boron nitride layer includes a vapor deposition thin film.

5. The surface acoustic wave device of claim 2, wherein said piezoelectric layer includes a single-crystalline piezoelectric material.

6. The surface acoustic wave device of claim 2, wherein said piezoelectric layer includes a polycrystalline piezoelectric material.

7. The surface acoustic wave device of claim 2, wherein said boron nitride layer includes a cubic boron nitride.

8. The surface acoustic wave device of claim 2, wherein said piezoelectric layer includes at least one compound selected from the group consisting of ZnO, AlN, $Pb(Zr,T)O_3$, $(Pb,La)(Zr,Ti)O_3$, $LiTaO_3$, $LiNbO_3$, $SiO_2$, $Ta_2O_5$, $Nb_2O_5$, BeO, $Li_2B_4O_7$, $KNbO_3$, ZnS, ZnSe and CdS.

9. The surface acoustic wave device of claim 2, wherein at least one of said electrodes is formed as a portion of said boron nitride layer containing an impurity.

10. The surface acoustic wave device of claim 2, wherein at least one of said electrodes is made of boron nitride containing an impurity.

11. A surface acoustic wave device comprising: a substrate; a first layer formed on said substrate, said first layer being substantially made of boron nitride material and being adapted so as to improve the velocity of a surface acoustic wave; a second layer of a piezoelectric material being in close contact with said first layer, said second layer being adapted so as to propagate a surface acoustic wave; and a pair of interdigital electrodes in close contact with said second layer, said electrodes being adapted so as to perform conversion between an electrical signal and a surface acoustic wave.

12. A surface acoustic wave device comprising: a substrate substantially made of boron nitride material, said substrate being adapted so as to improve the velocity of a surface acoustic wave; a piezoelectric layer formed on said substrate, said piezoelectric layer being adapted so as to propagate a surface acoustic wave; and a pair of interdigital electrodes being in close contact with said piezoelectric layer, said electrodes being adapted so as to perform conversion between an electrical signal and a surface acoustic wave.

13. A surface acoustic wave device comprising a piezoelectric material layer, electrode means disposed in direct contact with said piezoelectric material layer for generating a surface acoustic wave on said piezoelectric material layer, and boron nitride layer means consisting essentially of boron nitride and being disposed in direct contact with said piezoelectric material layer for increasing the propagation velocity of said surface acoustic wave.

14. The surface acoustic wave device of claim 13, further comprising a substrate not including boron nitride, said substrate being disposed in direct contact with said boron nitride layer means and opposite said piezoelectric material layer.

15. The surface acoustic wave device of claim 13, wherein said boron nitride layer means is an electrically insulating boron nitride layer.

16. The surface acoustic wave device of claim 13, wherein said electrode means comprise electrically conducting boron nitride including at least one member selected from the group consisting of impurities introduced by doping and lattice defects introduced by ion implantation.

17. The surface acoustic wave device of claim 13, wherein said boron nitride layer means consists essentially of single-crystalline boron nitride.

18. The surface acoustic wave device of claim 13, wherein said boron nitride layer means consists essentially of cubic boron nitride.

19. The surface acoustic wave device of claim 13, wherein said electrode means is arranged sandwiched between said piezoelectric material layer and said boron nitride layer means.

20. The surface acoustic wave device of claim 13, wherein said electrode means is arranged on a surface of said piezoelectric material layer opposite said boron nitride layer means.

* * * * *